(12) United States Patent
Koo et al.

(10) Patent No.: US 7,385,223 B2
(45) Date of Patent: Jun. 10, 2008

(54) FLAT PANEL DISPLAY WITH THIN FILM TRANSISTOR

(75) Inventors: Jae-Bon Koo, Yongin (KR); Ji-Yong Park, Suwon (KR); Hye-Hyang Park, Suwon (KR); Ki-Yong Lee, Yongin (KR); Ul-Ho Lee, Yongin (KR)

(73) Assignee: Samsung SDI Co., Ltd., Suwon (KR)

( * ) Notice: Subject to any disclaimer, the term of this patent is extended or adjusted under 35 U.S.C. 154(b) by 468 days.

(21) Appl. No.: 10/754,543

(22) Filed: Jan. 12, 2004

(65) Prior Publication Data

US 2004/0211961 A1 Oct. 28, 2004

(30) Foreign Application Priority Data

| Apr. 24, 2003 | (KR) | ................. 10-2003-0026004 |
| Apr. 24, 2003 | (KR) | ................. 10-2003-0026007 |
| May 1, 2003 | (KR) | ................. 10-2003-0027992 |
| Jun. 16, 2003 | (KR) | ................. 10-2003-0038826 |

(51) Int. Cl.
*H01L 31/036* (2006.01)

(52) U.S. Cl. ............ 257/72; 257/88; 257/E27.11; 257/E29.024

(58) Field of Classification Search .......... 257/72, 257/73, 75, 200, 71, 69, 77, 59, 88, 89, 90, 257/91, 92, 93, 64, E27.111, E21.134, E29.003, 257/E29.024; 349/139, 143, 43, 42
See application file for complete search history.

(56) References Cited

U.S. PATENT DOCUMENTS 6,503,782 B2 * 1/2003 Casady et al. ............... 438/135

| 6,587,174 | B1 * | 7/2003 | Nakano | ............ 349/139 |
| 6,828,951 | B2 * | 12/2004 | Yamazaki et al. | ............ 345/77 |
| 6,876,001 | B2 * | 4/2005 | Koo et al. | ............ 257/72 |
| 2003/0183854 | A1 * | 10/2003 | Kato et al. | ............ 257/200 |
| 2005/0068272 | A1 * | 3/2005 | Yoneda | ............ 345/76 |

FOREIGN PATENT DOCUMENTS

| JP | 04-279064 | * 10/1992 |
| JP | HEI 5-107561 | 4/1993 |
| JP | 5-190853 | * 7/1993 |
| JP | 05-323361 | * 12/1993 |
| JP | 6-59278 | * 3/1994 |
| JP | 06-125084 | 5/1994 |
| JP | 11-284188 | 10/1999 |
| JP | 11281997 | * 10/1999 |
| JP | 2001-051622 | 2/2001 |
| JP | 2001-109399 | 4/2001 |
| JP | 2001-290441 | 10/2001 |
| JP | 084307 | * 3/2003 |
| KR | P2000-0062728 | 10/2000 |
| KR | 1020010050816 | 6/2001 |

* cited by examiner

*Primary Examiner*—Thomas Dickey
*Assistant Examiner*—Fazli Erdem
(74) *Attorney, Agent, or Firm*—H.C. Park & Associates, PLC

(57) ABSTRACT

A flat panel display is provided. The flat panel display includes a light emitting device and two or more thin film transistors (TFTs) having semiconductor active layers having channel regions, where the thickness of the channel regions of the TFTs are different from each other. Thus, higher switching properties of a switching TFT can be maintained, a more uniform brightness of a driving TFT can be satisfied, and a white balance can be satisfied without changing a size of the TFT active layer.

37 Claims, 12 Drawing Sheets

FLAT PANEL DISPLAY WITH THIN FILM TRANSISTOR

RELATED APPLICATIONS

This application claims the priorities of Korean Patent Applications No. 2003-26004, filed on Apr. 24, 2003, No. 2003-26007, filed on Apr. 24, 2003, No. 2003-27992, filed on May 1, 2003, and No. 2003-38826, filed on Jun. 16, 2003, in the Korean Intellectual Property Office, the disclosures of which are incorporated herein in their entirety by reference.

FIELD OF THE INVENTION

The present invention relates to an active matrix type flat panel display including a thin film transistor (TFT), and more particularly, to a flat panel display including a TFT having a polycrystalline silicon as an active layer, and channel regions of the active layers in each of TFTs having different thickness and crystal grains of different sizes from each other.

BACKGROUND OF THE INVENTION

A thin film transistor (TFT) in a flat display device, such as a liquid display device, an organic electroluminescence display device, or an inorganic electroluminescence display device, is used as a switching device for controlling operations of pixels, a driving device for driving the pixels, or as a complementary metal oxide semiconductor (CMOS) TFT.

The TFT includes a semiconductor active layer having a drain area, a source area doped with impurities of high concentration and a channel region formed between the drain area and the source area. A gate insulating layer is formed on the semiconductor active layer, and a gate electrode is formed on the gate insulating layer which is located on an upper part of the channel region of the active layer. The semiconductor active layer can be classified into an amorphous silicon and polycrystalline silicon according to crystallized status of the silicon.

The TFT using the amorphous silicon has an advantage in that a deposition can be performed at a low temperature. However, it also has disadvantages in that the electrical property and reliability of the TFT are degraded and it is difficult to make the display device a larger area. Thus, the polycrystalline silicon has been generally used only recently. The polycrystalline silicon has a higher mobility of tens of hundreds of $cm^2/V.s$, and a low high frequency operation property and leakage current value, and thus may be suitable for use in the flat panel display with a high resolution and larger area.

On the other hand, the organic electroluminescence device has an emission layer made of an organic material between an anode electrode and a cathode electrode. In the organic electroluminescence device, when a positive voltage and a negative voltage are respectively applied to the electrodes, holes injected from the anode electrode are moved to the emission layer through a hole transport layer, and electrons are injected into the emission layer through an electron transport layer from the cathode electrode. The holes and electrons are recombined on the emission layer to produce exitons. The exitons are changed from an excited status to a ground status, causing phosphor molecules of the emission layer to radiate to form an image. In a full-color electroluminescence display, pixels radiating red (R), green (G), and blue (B) colors are disposed on the electroluminescence devices to realize the full colors.

However, luminous efficiencies of R, G, and B light emission layers are different from each other in the above organic electroluminescence device. Where the same currents are applied, a certain color has a low luminous brightness and a certain color has a high luminous brightness according to the luminous efficiencies. Therefore, it is difficult to obtain appropriate color balance and/or white balance. For example, the luminous efficiency of the G emission layer three to six times higher than that of the R emission layer and the B emission layer, and therefore, more electric currents are applied to the R and B emission layers to maintain the white balance.

In order to balance the white balance, Japanese Patent Laid-open Number hei 5-107561 discloses a method of applying different voltages, that is, Vdd values which are supplied through a driving line to pixels.

Also, Japanese Patent Laid-open No. 2001-109399 discloses a method of balancing the white balance by controlling a size of the driving TFT. That is, when a channel width of the channel region of the driving TFT is W and a length of the channel is L, W/L rates of R, G, and B pixels are set to be different to control the amount of current flowing in the R, G, and B electroluminescence devices.

Japanese Patent Laid-open No. 2001-290441 discloses a method of balancing the white balance by forming the pixels with different sizes. That is, the luminous area of the G emission area having the highest luminous efficiency is formed to be the smallest among the R, G, and B emission areas to obtain the white balance and long lifespan. The difference in the luminous areas can be realized by forming anode electrodes having different areas.

In addition to the above methods, a method for controlling the amount of current by differentiating voltage ranges applied to the R, G, and B pixels through the data line may be used to control the brightness.

However, the above methods do not consider the crystallization structures in the TFT of the flat panel display devices using the polycrystalline silicon. That is, the crystal grain of the TFT active layer may have various shapes and sizes according to the crystallization methods, and the current mobility can be differentiated from the shapes and sizes of the crystal grains. Then, the white balance cannot be balanced using the above methods.

Also, in the organic electroluminescence devices, when the amount of current flowing in the sub-pixels of the organic electroluminescence device exceeds the limit, the brightness per unit area increases greatly, and accordingly, the lifespan of the organic electroluminescence device is reduced. Therefore, optimal currents should be applied to the sub-pixels in order to maintain the lifespan of the device.

On the other hand, in the active matrix type organic electroluminescence display device, a panel with a high resolution is required. However, the above described TFT formed using the polycrystalline silicon having a high function causes some problems in this case.

That is, in the active matrix type flat panel display device such as the active matrix type organic electroluminescence display device, the switching TFT and the driving TFT are made of the polycrystalline silicon. Alternatively, a circuit unit TFT and a pixel unit TFT, especially the driving TFT, are fabricated using the polycrystalline silicon, thus, the driving TFT and the switching TFT, or the circuit unit TFT, have the same current mobility. Therefore, switching properties of the switching TFT, or the circuit unit TFT, and low current driving properties of the driving TFT cannot be satisfied simultaneously. That is, where the driving TFT, and the switching TFT or the circuit unit TFT of the high resolution display device are fabricated using the polycrystalline silicon having a larger current mobility, the high switching property of the switching TFT or the circuit unit TFT can be obtained. However, brightness becomes too high since a current flowing toward an electroluminescence (EL) device through the driving TFT increases, thus increasing a current density per unit area and decreasing a life time of the EL device.

On the other hand, where the switching TFT or circuit unit TFT, and the driving TFT of the display device are fabricated using the amorphous silicon having the low current mobility, the TFTs should be fabricated so that the driving TFT uses a small current and the switching TFT or the circuit unit TFT uses a large current.

To solve the above problems, methods for restricting current flowing through the driving TFT are provided, such as a method for increasing the resistance of a channel region by reducing a ratio of a length to a width of the driving TFT (W/L) and a method for increasing the resistance by forming a low doped area on the source/drain areas of the driving TFT.

However, in the method of decreasing the W/L by increasing the length, stripes are formed on the channel region and reduce an aperture area in a crystallization process in an excimer laser annealing (ELA) method. The method decreasing W/L by reducing the width is limited by a design rule of a photolithography process, and it is difficult to ensure the reliability of the TFT. Also, the method for increasing the resistance by forming the low doped area requires an additional doping process.

A method for increasing TFT properties by reducing an entire thickness of the channel region is disclosed in U.S. Pat. No. 6,337,232.

Circuits using the CMOS TFT are used to drive the active matrix liquid crystal display device, the organic electroluminescence device, and an image sensor. However, absolute values of threshold voltages of a P type TFT and an N type TFT are different in the CMOS TFT. Thus, it is not suitable for using the CMOS TFT to drive the circuit.

For example, if the threshold voltage of the N type TFT is 2V, the threshold voltage of the P type TFT is −4V. Therefore, the P type TFT having a larger absolute value of the threshold voltage is not appropriately operated by the low driving voltage. That is, the P type TFT is only operated as a passive device, such as a register. Thus, the driving voltage should be high enough to drive the P type TFT as an active device.

Especially, in a case where the gate electrode is made of a material having a work function less than 5 eV, such as the aluminum, the difference between the work functions of the gate electrode and an intrinsic silicon semiconductor is reduced as much as −0.6 eV. Consequently, the threshold voltage of the P type TFT is shifted to be a negative (−) value, and the threshold voltage of the N type TFT is nearly 0. That is, the N type TFT is likely rendered to be an on-status.

In the above circumstances, it is desirable to approximately equalize the absolute value of a threshold voltage of the N-channel TFT to that of the P-channel TFT. In the case of conventional mono-crystalline semiconductor integrated circuit technology, the threshold voltages have been controlled by using N or P type impurity doping at a very small concentration, typically, less than $10^{18}$ atoms/cm$^3$. The threshold voltages can be controlled with an accuracy of 0.1 V or less by an impurity doping of $10^{15}$ to $10^{18}$ atoms/cm$^3$.

However, in the case of using non-single crystalline semiconductors, even if an impurity is added at $10^{18}$ atoms/cm$^3$ or less, the shift of the threshold voltage is hardly observed. Moreover, if the concentration of the impurity exceeds $10^{18}$, the threshold voltage rapidly varies and the conductivity becomes p-type or n-type because polycrystalline silicon generally has a lot of defects in it. Since the defect density is $10^{18}$ atoms/cm$^3$, the added impurities are trapped by these defects and cannot be activated. Further, if the concentration of the impurity becomes larger than the defect density, the excess impurity is activated and changes the conductivity type to p-type or n-type.

In order to solve the above problems, U.S. Pat. No. 6,492,268, U.S. Pat. No. 6,124,603, and U.S. Pat. No. 5,615,935 disclose a method of fabricating a channel length of the P type TFT less than that of the N type TFT. However, according to above method, the channel lengths are varied, thus complicating the fabrication processes. The method for reducing a ratio of a length for a width of the driving TFT is disclosed in Japanese Patent Publication No. 2001-109399.

SUMMARY OF THE INVENTION

The present invention provides a flat panel display in which an on-current of a driving thin film transistor (TFT) is lowered while keeping constant a driving voltage applied thereto without changing a size of an active layer of the TFT.

The present invention also provides a flat panel display capable of maintaining high switching properties of a switching TFT, satisfying uniform brightness by a driving TFT, and maintaining a life span of a light emitting device.

The present invention also provides a flat panel display which can balance the white balance according to differences between the thickness and crystal grain sizes of driving TFT active layers.

The present invention also provides a flat panel display which can maintain the white balance with same driving voltages of the TFTs, without changing the size of the driving TFT active layer.

The present invention further provides a flat panel display of appropriate brightness and lifespan by supplying optimal current to each of the sub-pixels.

The present invention also provides a flat panel display including a TFT having high property values without changing the size of the TFT active layer.

The present invention also provides a flat panel display including a complementary metal oxide semiconductor (CMOS) TFT, in which the difference between threshold values of P type TFT and N type TFT may be reduced by controlling sizes of the crystal grains when the channel region is crystallized, and the CMOS TFT has high current mobility.

According to an aspect of the present invention, there is provided a flat panel display comprising a light emitting device, and at least two or more thin film transistors including semiconductor active layers having channel regions. In addition, the thickness of the channel regions of the thin film transistors are different from each other.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
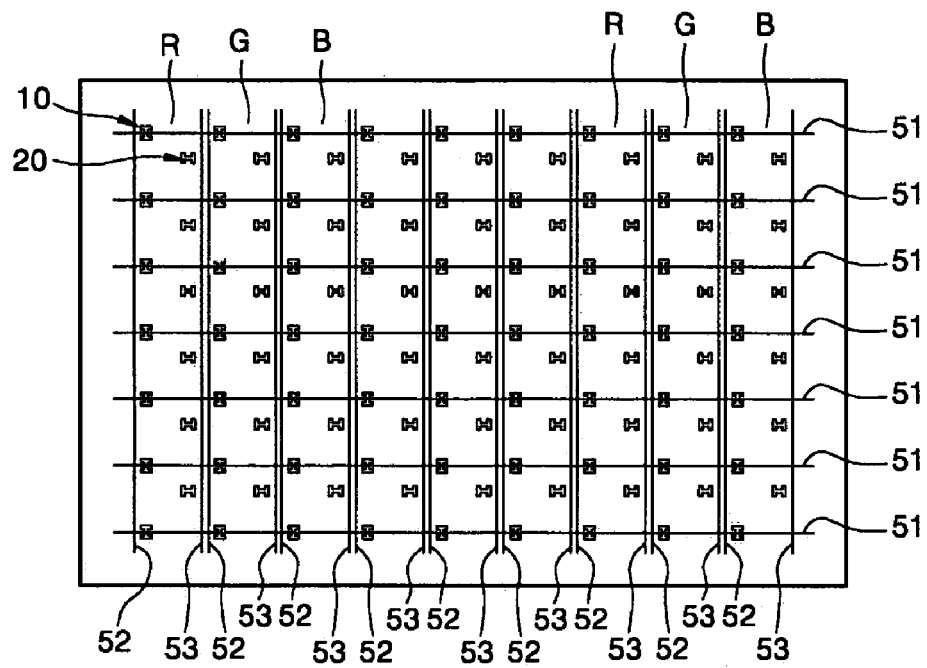
FIG. 1 is a plane view of a structure of an active layer on a thin film transistor (TFT) in an active matrix type electroluminescence display device according to an embodiment of the present invention.

FIG. 1 is a plane view of an active layer structure of a thin film transistor (TFT) in an active matrix type organic electroluminescence display according to an embodiment of the present invention. In FIG. 1, red (R), green (G), and blue (B) sub-pixels are repeatedly arranged in a longitudinal direction (up-and-down direction in FIG. 1) in a pixel of the organic electroluminescence display. However, it is understood that the arrangement of the pixels is not limited to the above structure, and the sub-pixels of respective colors may be arranged in various patterns, such as a mosaic pattern, or a grid type pattern, to construct the pixel. Also, a mono color flat panel display may be used instead of a full-color flat panel display shown in FIG. 1.

In the organic electroluminescence display, a plurality of gate lines 51 are arranged in a transverse direction (left-and-right direction in FIG. 1), and a plurality of data lines 52 are arranged in a longitudinal direction. Also, driving lines 53 for supplying driving voltages (Vdd) are arranged in the longitudinal direction. The gate line 51, the data line 52, and the driving line 53 are disposed to surround one sub-pixel.

In above construction, each sub-pixel of the R, G, and B pixels may include at least two TFTs, such as a switching TFT and a driving TFT. The switching TFT transfers a data signal to a light emitting device, according to a signal of the gate line 51, to control operations of the light emitting device. The driving TFT drives the light emitting device so that a predetermined current flows to the light emitting device according to the data signal. The number of TFTs and arrangement of TFTs, such as the switching TFT and the driving TFT may be varied based on properties of the display device and a driving method of the display device.

Figure 2:
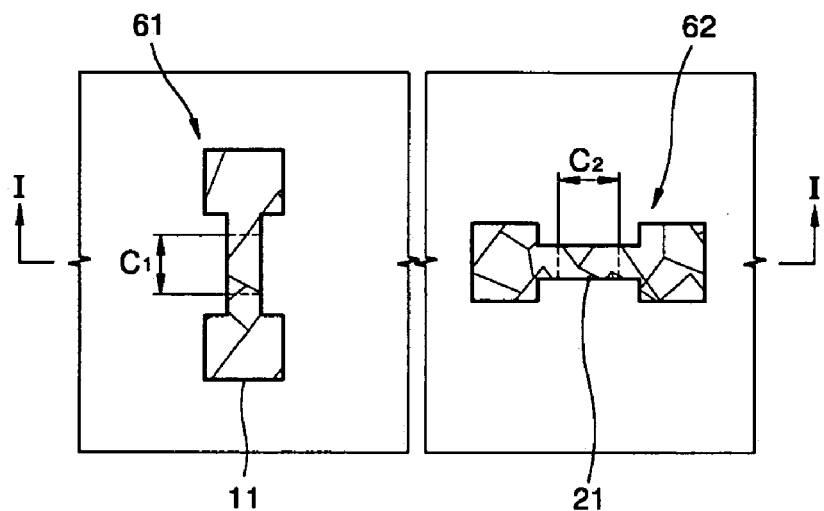
FIG. 2 is a plane view of crystallized structures of a first active layer of a switching TFT and a second active layer of a driving TFT.

As shown in FIG. 2, the switching TFT 10 and the driving TFT 20 include a first active layer 11 and a second active layer 21 respectively, e.g., semiconductor active layers, and the active layers 11 and 21 include channel regions $C_1$ and $C_2$, respectively, which will be described in greater detail below. The channel regions are the areas located on center portions of the first active layer 11 and the second active layer 21 in a current flowing direction.

As shown in FIG. 1, in sub-pixels forming the R, G, and B pixels, the first active layer 11 included in the switching TFT 10 and the second active layer 21 included in the driving TFT 20 can be formed of a different thicknesses from each other. The first active layer 11 and the second active layer 21 can be formed commonly regardless of the R, G, and B pixels. However, although not shown in the drawings, a white balance can be maintained by differentiating a crystallized structure of the second active layer 21 forming the driving TFT 20.

According to an embodiment of the present invention, the first active layer 11 and the second active layer 21 may be formed using a polycrystalline silicon thin film. The first active layer 11 and the second active layer 21 formed by the polycrystalline silicon thin film can be formed of a different thickness in the channel regions. In an embodiment of the present invention, of the first active layer 11 and the second active layer 21, the active layer of the TFT which requires larger current mobility value than the other between the may be formed to have a thinner channel region. The channel regions on center portions of the first active layer 11 and the second active layer 21 may have a different thickness. However, the entire thicknesses of the first and second active layers may be different from each other due to the complexity in designing the above structure.

The changes in the thickness of the channel region of the TFT active layer may cause changes in the TFT properties. When the thickness of the channel region on the active layer is relatively thin, the current mobility may increase on the channel region, and accordingly, improved TFT properties may be obtained. Therefore, when the thickness of the channel region on the TFT active layer requiring higher current mobility value is formed to be thin, improved TFT properties can be obtained. Accordingly, the thickness of the first active layer 11 on the switching TFT 10 is formed thinner than that of the second active layer 21 of the driving TFT 20. The improved TFT properties can be achieved in the amorphous silicon, as well as the polycrystalline silicon.

On the other hand, sizes of the crystal grains can be differentiated when the amorphous silicon is crystallized into the polycrystalline silicon by forming the channel regions of the first active layer 11 of the switching TFT 10 and the second active layer 21 of the driving TFT 20 to have a different thickness from each other. Accordingly, the current mobility can be differentiated. An additional process for controlling the size of crystal grain may not be required, and even if the laser is irradiated to two active layers simultaneously in the crystallization process by the ELA method, the active layers having different crystal grain sizes can be obtained.

Therefore, the sizes of the active layers, e.g., plane areas of the active layers, are the same, and higher resolution may be realized by reducing the current transferred from the driving TFT to the light emitting device.

In an organic electroluminescence display device, an on-current of the switching TFT may increase and the on-current of the driving TFT may decrease to form a TFT suitable for the higher resolution, especially for the high resolution of a small size. In an embodiment of the present invention, the different on-currents can be realized by forming the active layers of the respective TFTs to have a different thickness from each other. That is, the on-current of the switching TFT is increased and the on-current of the driving TFT is decreased by controlling the thickness of the channel regions of the active layers on the TFTs.

The thickness of the channel region of the switching TFT active layer and the thickness of the channel region of the driving TFT active layer can be decided by the current mobilities on the channel regions. When the current mobility on the channel region of the active layer is large, the on-current is also large, and when the current mobility on the channel region is small, the on-current is also small. Consequently, in order to realize the higher resolution by reducing the on-current of the driving TFT, the thickness of the channel regions of the active layers should be controlled so that the current mobility on the channel region of the driving TFT active layer is smaller than the current mobility on the channel region of the switching TFT active layer.

Figure 3:
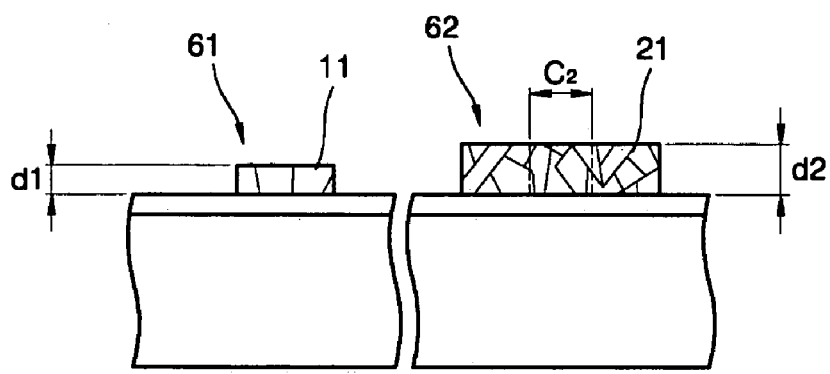
FIG. 3 is a cross-sectional view of different thicknesses of the first active layer of the switching TFT and the second active layer of the driving TFT in the direction of line I-I in FIG. 2.

Therefore, as shown in FIG. 3, when the thickness (d1) of the first active layer 11 of the switching TFT is thinner than the thickness (d2) of the second active layer 21 of the driving TFT, the current mobility on the channel region of the switching TFT increases and the current mobility on the channel region of the driving TFT decreases relatively. The above operations can be performed on the active layer formed using the amorphous silicon. According to an embodiment of the invention, the entire thickness of the first and second active layers 11 and 21 are controlled in FIG. 3, however, only the thickness of the channel region may be controlled.

Controlling the thickness of the channel region on the respective active layer may affect the size of the crystal grain according to the crystallization of the silicon thin film. That is, the energy density applied to the amorphous silicon is differentiated from the thickness of the silicon thin film when the amorphous silicon is crystallized by the laser. Accordingly, the size of the crystal grain of the polycrystalline silicon thin film is differentiated, thereby differentiating the current mobility of the channel region.

FIG. 2 is a view of the first active layer of the switching TFT and the second active layer 21 of the driving TFT adopting different crystallization structures of polycrystalline silicon thin films. The polycrystalline silicon thin film is formed by crystallizing the amorphous silicon thin film in an excimer laser annealing (ELA) method. Previously described FIG. 3 is a cross-sectional view in line I-I direction of FIG. 2.

Figure 4:
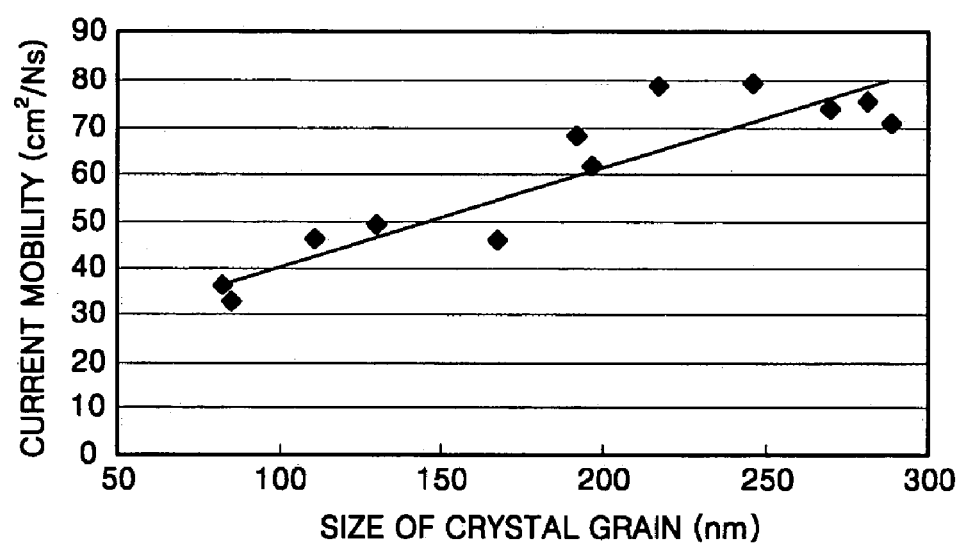
FIG. 4 is a graph of a relation between a size of a crystal grain and a current mobility.

As shown in FIG. 4, the larger the size of crystal grain is, the larger the current mobility is, thus forming a nearly straight line.

Therefore, in the embodiment of the present invention shown in FIG. 2, the size of the crystal grain on the channel region of the switching TFT active layer, which requires larger current mobility, is larger than the size of the crystal grain on the channel region of the driving TFT active layer, which requires smaller current mobility. Consequently, the on-current value of the driving TFT can be lowered.

That is, as shown in FIG. 2, the first active layer 11 of the switching TFT is formed on a first crystallization structure 61 having a larger crystal grain, and the second active layer 21 of the driving TFT is formed on a second crystallization structure 62 having a smaller crystal grain. The crystallization structures on the channel regions of the respective active layers can be differentiated from each other.

The difference in the crystal grain size may be obtained by differentiating the thickness of the active layers from each other as shown in FIG. 3. That is, the thickness d1 of the silicon thin film having the first crystallization structure 61, on which the first active layer 11 of the switching TFT is formed, is formed thinner than the thickness d2 of the silicon thin film having the second crystallization structure 62 on which the second active layer 21 of the driving TFT is formed.

Figure 5:
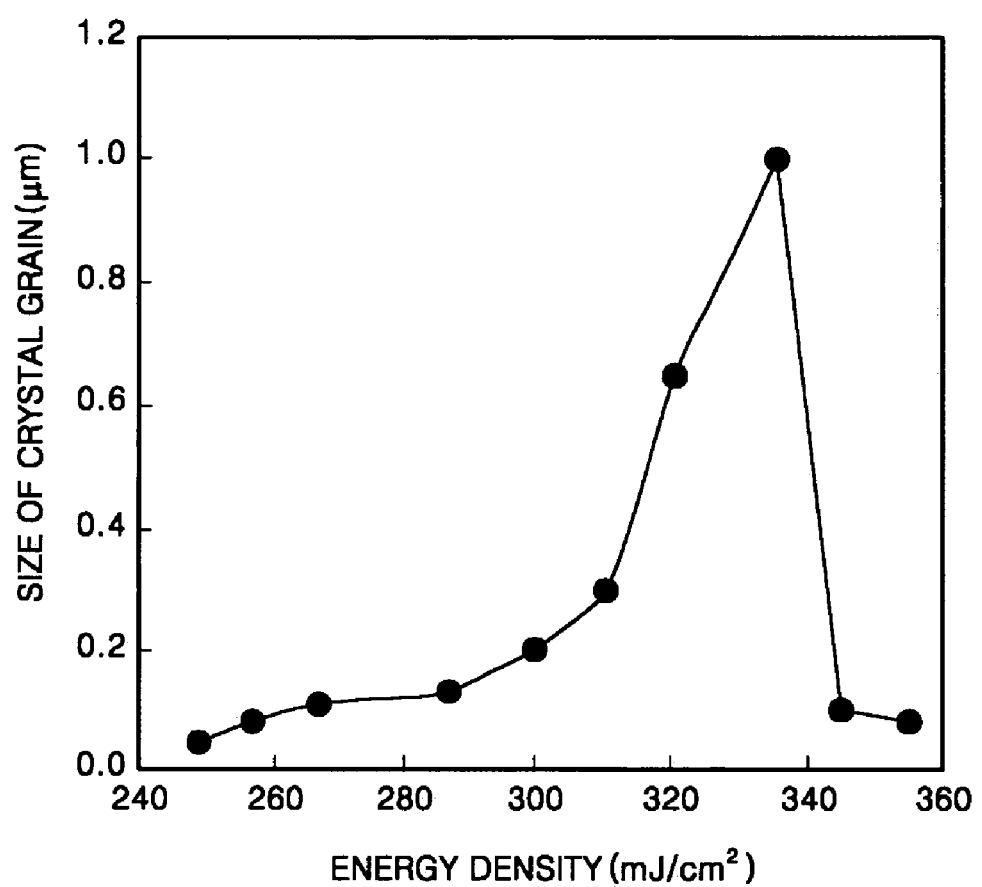
FIG. 5 is a graph of a relation between an energy density and a size of a crystal grain in an excimer laser annealing (ELA) method.

When the thickness of the silicon thin film becomes thinner, the energy density applied to the amorphous silicon becomes higher, and larger crystal grain can be obtained by a relation shown in FIG. 5. FIG. 5 is a view of a difference between the sizes of crystal grains according to the energy densities of the irradiating laser, in the crystallization process of the amorphous silicon thin film of about 500 Å in the ELA method. When the amorphous silicon thin film receives the lapser of excessively high energy density, the silicon thin film may be melted completely and the size of the crystal grain may become smaller. Therefore, it is preferable that the silicon thin film of the first crystallization structure 61 on which the first active layer 11 of the switching TFT requiring larger crystal grain not be formed excessively thin.

Therefore, the thickness d1 of the silicon thin film on which the first active layer 11 of the switching TFT will be formed may be in a range of 300- to about 800 Å, and the thickness d2 of the silicon thin film on which the second active layer 21 of the driving TFT may be formed in a range of about 500 to about 1500 Å. A photolithography process may be performed to differentiate the thicknesses of the silicon thin films. In the photolithography method, the thickness of the patterned amorphous silicon thin film is controlled by controlling light transmittance of an optical mask for the area on which the first active layer of the switching TFT will be formed and for the area on which the second active layer of the driving TFT will be formed.

The thickness d1 of the silicon thin film on which the first active layer 11 of the switching TFT will be formed is formed thinner than the thickness d2 of the silicon thin film on which the second active layer 21 of the driving TFT will be formed. This increases the size of crystal grain so that the current mobility on the channel region of the first active layer 11 of the switching TFT is larger than the current mobility on the channel region of the second active layer 21 of the driving TFT. Consequently, the on-current of the driving TFT can be lowered, thus realizing the high resolution. Also, according to an embodiment of the present invention, the sizes of a crystal grain can be differentiated from each other with one laser irradiation using the thickness difference, thereby simplifying the process for fabricating a TFT.

The sub-pixel of the organic electroluminescence display device having the switching TFT and the driving TFT may have a structure as shown in FIGS. 6 through 9.

Figure 6:
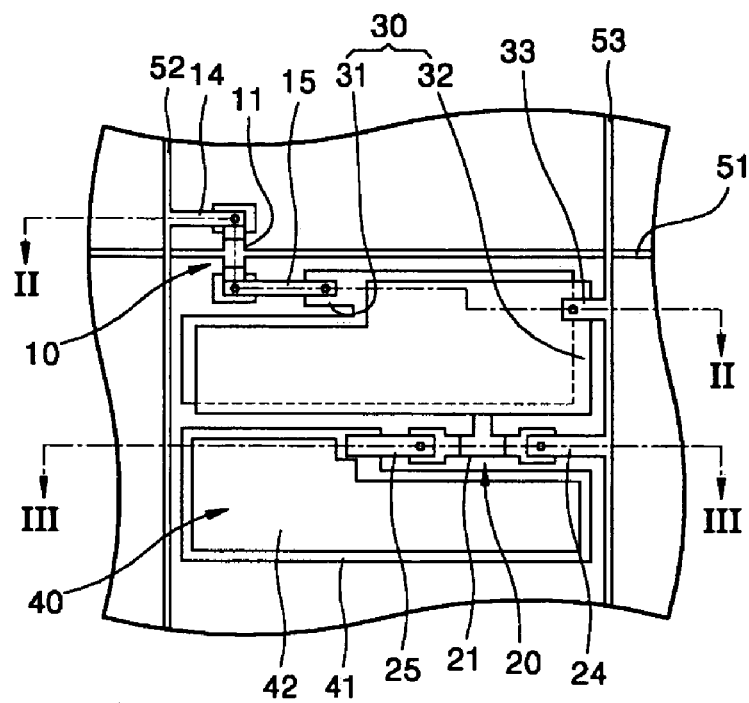
FIG. 6 is a partially enlarged view of one sub-pixel in FIG. 1.
Figure 7:
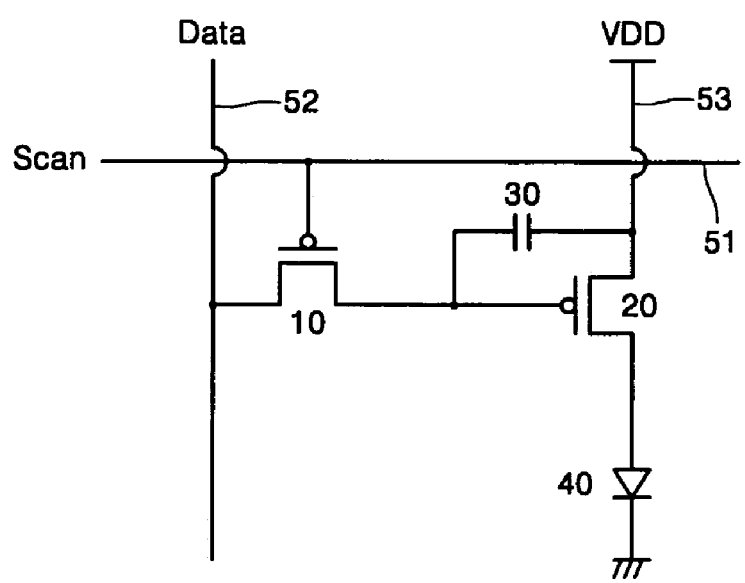
FIG. 7 is an equivalent circuit diagram of a unit pixel in FIG. 6.

FIG. 6 is a partially enlarged plane view of a sub-pixel among the sub-pixels in FIG. 1, and FIG. 7 is a view of an equivalent circuit of the sub-pixel shown in FIG. 6.

Referring to FIG. 7, the respective sub-pixel of the active matrix type organic electroluminescence display according to an embodiment of the present invention includes two TFTs such as a switching TFT 10 for switching and a driving TFT 20 for driving, a capacitor 30, and an electroluminescence (EL) device 40. The number of TFTs and the number of capacitors are not limited thereto, as more TFTs and capacitors can be included according to a design of a desired device.

The switching TFT 10 is operated by a scan signal which is applied to the gate line 51 to transfer a data signal which is applied to the data line 52. The driving TFT 20 controls a current flowing into the EL device 40 according to the data signal transferred through the switching TFT 10, that is, voltage difference between a gate and a source. The capacitor 30 stores the data signal transferred through the switching TFT 10 for one frame unit.

Figure 8:
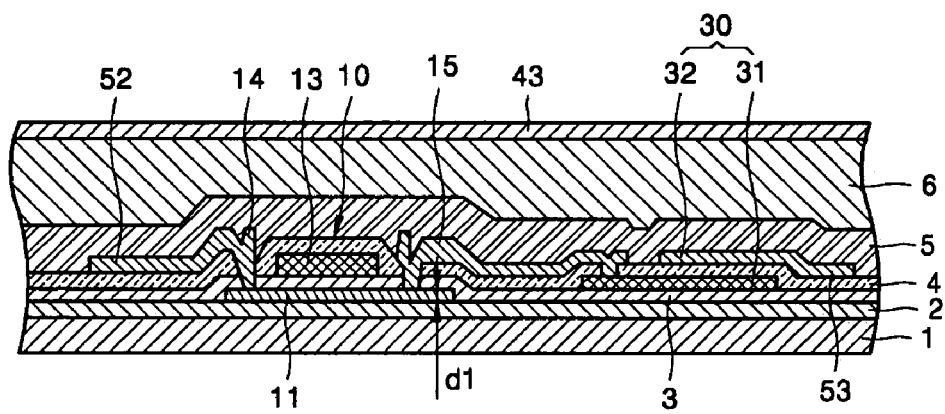
FIG. 8 is a cross-sectional view in the direction of line II-II in FIG. 6.
Figure 9:
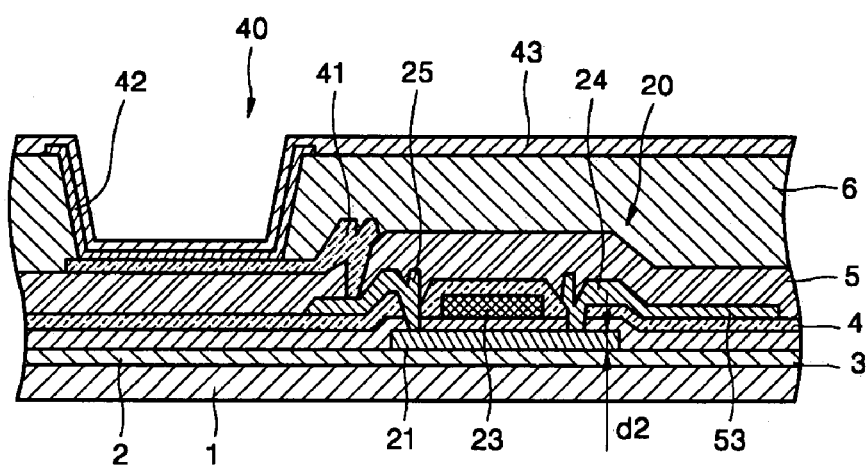
FIG. 9 is a cross-sectional view in the direction of line III-III in FIG. 6.

The organic electroluminescence display devices having the structure shown in FIGS. 6, 8, and 9 are formed to realize the above circuit. As shown in FIGS. 6, 8, and 9, a buffer layer 2 is formed on an insulating substrate 1 made of glass, and the switching TFT 10, the driving TFT 20, the capacitor 30, and the EL device 40 are disposed on the buffer layer 2.

The switching TFT 10 includes a gate electrode 13 connected to the gate line 51 for applying TFT on/off signals, a source electrode 14 formed on the gate electrode 13 and connected to the data line 52 for supplying the data signal to the first active layer, and a drain electrode 15 connecting the switching TFT 10 with the capacitor 30 to supply power source to the capacitor 30. A gate insulating layer 3 is disposed between the first active layer 11 and the gate electrode 13.

The capacitor 30 for charging is located between the switching TFT 10 and the driving TFT 20 for storing a driving voltage required to drive the driving TFT 20 for one frame unit. The capacitor 30 may include a first electrode 31 connected to the drain electrode 15 of the switching TFT 10, a second electrode 32 formed to overlap with the first electrode 31 on an upper part of the first electrode 31 and connected to a driving line 53 through which the power source is applied, and an interlayer dielectric layer 4 formed between the first electrode 31 and the second electrode 32 to be used as a dielectric substance, as shown in FIGS. 6 and 8. It is understood that the structure of the capacitor 30 is not limited to the above. For example, a gate insulating layer may be used as the dielectric layer.

As shown in FIGS. 6 and 9, the driving TFT 20 includes a gate electrode 23 connected to the first electrode 31 of the capacitor 30 for supplying TFT on/off signals, a source electrode 24 formed on an upper part of the gate electrode 23 and connected to the driving line 53 for supplying a reference common voltage to the second active layer 21, and a drain electrode 25 connecting the driving TFT 20 with the EL device 40 for applying a driving voltage to the EL device 40. A gate insulating layer 3 is disposed between the second active layer 21 and the gate electrode 23. Here, the channel region of the active layer 21 of the driving TFT 20 has a different crystallization structure from that of the channel region of the first active layer 11 of the switching TFT 10, e.g., a different size in the crystal grain.

As shown in FIGS. 8 and 9, the thickness d1 of the first active layer 11 of the switching TFT is formed to be thinner than the thickness d2 of the second active layer 21 of the driving TFT. Therefore, the size of crystal grain of the first active layer 11 is formed to be larger than the size of the crystal grain of the second active layer 21 by irradiating the laser for one time in the ELA method.

The EL device 40 displays a predetermined image information by emitting lights of red, green, and blue colors according to flows of the current. As shown in FIGS. 6 and 9, the EL device 40 includes an anode electrode 41 connected to the drain electrode 25 of the driving TFT 20 for receiving positive power source from the drain electrode 25, a cathode electrode 43 disposed to cover the entire pixel for supplying negative power source, and an organic emission layer 42 disposed between the anode electrode 41 and the cathode electrode 43 for emitting lights. An insulating passivation layer 5 may be made of $SiO_2$, and an insulating planarized layer 6 may be made of acryl, or polyimide.

The above layered structure of the organic electroluminescence display according to the embodiment of the present invention is not limited thereto, and the present invention may be applied to different structures than those described above.

The organic electroluminescence display having the above structure according to the embodiment of the present invention may be fabricated as follows. As shown in the exemplary embodiments of FIGS. 8 and 9, a buffer layer 2 is formed on an insulating substrate of glass material. The buffer layer 2 can be formed using $SiO_2$ and can be deposited using a plasma enhanced chemical vapor deposition (PECVD) method, an atmospheric pressure chemical vapor deposition (APCVD) method, a low pressure chemical vapor deposition (LPCVD) method, or an electron cyclotron resonance (ECR) method. Also, the buffer layer 2 can be deposited to have a thickness of about 3000 Å.

An amorphous silicon thin film is deposited on an upper part of the buffer layer 2, and the photolithography process is performed on the silicon thin film so that the thickness d1 of the area on which the first active layer 11 of the switching TFT 10 will be formed in a range of about 300 to about 800 Å, and the thickness d2 of the area on which the second active layer 21 of the driving TFT 20 will be formed in a range of about 500 to about 1500 Å. The difference in the thickness can be generated with one exposure process by differentiating the light transmittance of the optical masks. That is, after applying a photoresist on the areas on which the first active layer 11 of the switching TFT 10 and the second active layer 21 of the driving TFT 20 will be formed, the photoresist is exposed using masks having a different light transmittance from each other, developed, and etched.

The amorphous silicon thin film formed as described above can be crystallized into the polycrystalline silicon thin film in various ways. Energy densities applied to the area on which the second active layer 21 of the driving TFT 20 will be formed and to the area on which the first active layer 11 of the switching TFT 10 will be formed may be different from each other, thus, increasing the size of crystal grain on the area of the first active layer.

The first active layer 11 of the switching TFT 10 and the second active layer 21 of the driving TFT 20 are patterned, as shown in FIG. 1, after making the different crystallization structures. The patterning process of the active layers may be performed simultaneously with the process of generating a thickness difference on the amorphous silicon thin film, or performed after depositing the gate insulating layer and the gate electrode.

After performing the patterning process of the active layers, the gate insulating layer is deposited on the patterned layers in PECVD, APCVD, LPCVD, or ECR methods, and a conductive layer is formed using MoW, or Al/Cu and patterned to form the gate electrode. The active layer, the gate insulating layer, and the gate electrode may be patterned in various orders and methods.

After patterning the active layer, the gate insulating layer, and the gate electrode, N-type or P-type impurities are doped on the source and drain areas. As shown in FIGS. 8 and 9, after completing the doping process, an interlayer dielectric layer 4 is formed, the source electrodes 14 and 24 and the drain electrodes 15 and 25 are connected to the active layers 11 and 21 through contact holes, and a passivation layer 5 is formed. The layers may adopt various structures according to design of the device.

The EL device 40 connected to the driving TFT 20 can be formed in various ways. For example, an anode electrode 41 connecting to the drain electrode 25 of the driving TFT 20 may be formed and patterned on the passivation layer 5 using an indium tin oxide (ITO), and a planarized layer 6 may be formed on the anode electrode 41.

After exposing the anode electrode 41 by patterning the planarized layer 6, an organic layer 42 is formed thereon. Here, the organic layer 42 may use a low molecular organic layer or a high molecular organic layer. Where the low molecular organic layer is used, a hole injection layer, a hole transfer layer, an organic emission layer, an electron transfer layer, and an electron injection layer may be formed by being stacked in a single or a combination structure. Also, various organic materials such as copper phthalocyanine (CuPc), N,N-Di(naphthalene-1-yl)-N,N'-diphenyl-benzidine (NPB), and tris-8-hydroxyquinoline aluminum (Alq3) can be used. The low molecular organic layer is formed in a vacuum evaporation method.

The high molecular organic layer may include the hole transfer layer and an emission layer. Here, the hole transfer layer is formed using poly(3,4)-ethylenedioxythiophene (PEDOT), and the emission layer is formed using a high molecular organic material such as a poly-phenylenevinylene (PPV)-based material or a polyfluorene-based material in a screen printing method or in an inkjet printing method.

After forming the organic layer, the cathode electrode 43 is entirely deposited using Al/Ca, or patterned. An upper part of the cathode electrode 43 is sealed by a glass or a metal cap. Here, the cathode electrode 43 may be formed as a transparent electrode where the organic electroluminescence display device is a front light emitting type.

According to another embodiment of the present invention, the thickness of the channel region of the second active layers included in the driving TFT 20 can be differentiated from the sub-pixels in FIG. 1. The thickness of the channel regions can be differentiated by the colors. That is, the thickness of the driving TFT channel region forming the R pixel, the thickness of the driving TFT channel region forming the G pixel, and the thickness of the driving TFT channel region forming the B pixel are different from each other. In addition, if the sub-pixels include another color in addition to the R, G, and B colors, the thickness of that color may also be different from the others.

According to the still another embodiment of the present invention, second active layers 21r, 21g, and 21b of the driving TFTs in the sub-pixels are formed using polycrystalline silicon thin films, where, the thickness of the channel regions are different in the R, G, and B color pixels. Here, it is sufficient that the thickness of the channel regions on the center area of the second active layers 21r, 21g, and 21b are different from each other. However, the entire thickness of the second active layers may be different from each other due to the complexity of designing.

Since the thickness of the channel regions of the second active layers, which are used as the driving TFTs, are different from the pixels of R, G, and B colors, the entire sizes of the active layers, that is, the areas of the active layers, are the same and the white balance can be maintained by the same driving voltages.

As described above, in the organic electroluminescence device, since the luminous efficiencies of emission layers of R, G, and B sub-pixels are different from each other, the brightness becomes different from each other. Accordingly, the white balance becomes different with respect to the same voltages. Table 1 shows the currents that should flow to the R, G, and B organic emission layers, which are generally used in the organic electroluminescence device, to satisfy the luminous efficiencies and the white balance.

TABLE 1

|  | Red | Green | Blue |
| --- | --- | --- | --- |
| Efficiency (Cd/A) | 6.72 | 23.37 | 4.21 |
| Pixel current (μA) | 0.276 | 0.079 | 0.230 |
| Pixel current ratio | 3.5 | 1 | 2.9 |

As shown in Table 1, the current value of green sub-pixel for satisfying the white balance is the smallest, and the current value of red sub-pixel for satisfying the white balance is the largest.

The difference of currents can be compensated by making the thickness of channel regions on the driving TFT active layers, which supplies the emission device with currents, different from each other.

The TFT characteristics may be changed when the thickness of the channel regions of the TFT active layer become different from each other. When the thickness of the channel region on the active layer is relatively thin, the current mobility on the channel region may be reduced, and accordingly, superior TFT can be obtained. Therefore, when the thickness of the channel region on the TFT active layer requiring higher current mobility is formed to be thin, superior TFT characteristics can be obtained. The effect of obtaining superior TFT characteristics can be shown in amorphous silicon, as well as in the polycrystalline silicon.

Figure 10:
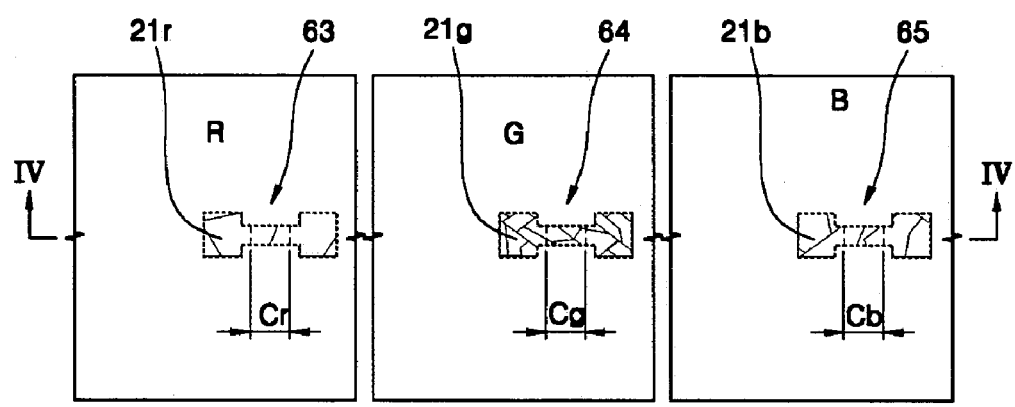
FIG. 10 is a plane view of crystallization structures of second active layers on red (R), green (G), and blue (B) color sub-pixels.

As shown in FIG. 10, the thickness of the channel regions of the second active layers 21r, 21g, and 21b can be controlled to be an inverse proportion to the currents flowing on the sub-pixels. That is, as described above, the thickness of the second active layer 21r of the R sub-pixel is formed to be relatively thin, and the thickness of the second active layer 21g of the G sub-pixel requiring the smallest current is formed to be relatively thick. Accordingly, the thickness of the second layers becomes thinner in order of G, B, and R colors.

The thickness of the channel regions on the second active layers 21r, 21g, and 21b can be formed to be in inverse proportion to the current mobilities on the channel regions. For example, if there are R, G, and B sub-pixels, the R color sub-pixel requires the largest current mobility for maintaining the white balance, and accordingly, the thickness of the second active layer 21r is formed to be relatively thin. In addition, the G color sub-pixel requires the smallest current mobility for maintaining the white balance, and accordingly, the thickness of the second active layer 21g is formed to be relatively thick. Accordingly, the thickness of the second active layers become thinner in order of G, B, and R colors.

The thickness control of the channel regions of the active layers can be performed on the active layer formed using the amorphous silicon.

The sizes of the crystallization grains can be formed to be different from each other when the amorphous silicon is crystallized into the polycrystalline silicon by controlling the thickness of the channel regions on the active layers. Accordingly, the current mobilities can be different from each other. In addition, different grain sizes can be obtained through radiating the laser to the three channel regions simultaneously, in a case where the crystallization is performed in an ELA method.

FIG. 10 is a view of crystallization structures of polycrystalline silicon thin film on the second active layers of the R, G, and B sub-pixels. The polycrystalline silicon thin film is formed by crystallizing the amorphous silicon thin film in the ELA method. FIG. 111 is a cross-sectional view cut in the direction of line IV-IV of FIG. 10.

Figure 11:
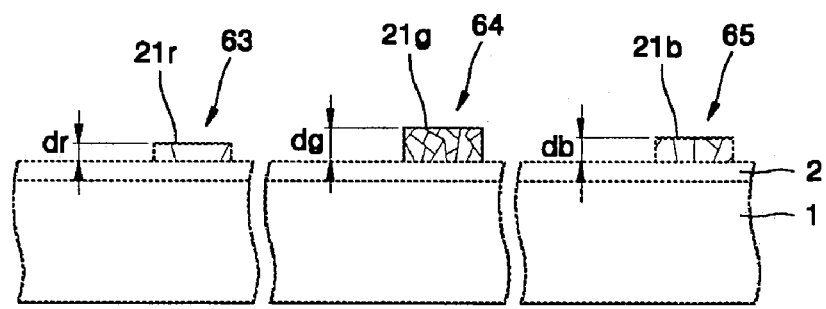
FIG. 11 is a cross-sectional view in the direction of line IV-IV of FIG. 10, showing different thickness of the second active layer of the driving TFTs in R, G, and B color sub-pixels.

As shown in FIG. 11, the second active layer 21r having a relatively thin thickness of the R sub-pixel is formed on the silicon thin film having a third crystallization structure 63, the second active layer 21g having a relatively thick thickness of the G sub-pixel is formed on the silicon thin film having a fourth crystallization structure 64, and the second active layer 21b having a median thickness of the B sub-pixel is formed on the silicon thin film having a fifth crystallization structure 65. Accordingly, as shown in FIG. 10, the second active layer 21r of the R sub-pixel is formed on the third crystallization structure 63 having the largest grain size, the second active layer 21g of the G sub-pixel is formed on the fourth crystallization structure 64 having the smallest grain size, and the second active layer 21b of the B sub-pixel is formed on the fifth crystallization structure 65 having a median grain size. These structures are fabricated by differentiating the thickness of the amorphous silicon, crystallizing the amorphous silicon, and patterning the polycrystalline silicon.

According to the different crystal grain sizes due to the different silicon thin film, the current mobility is also differentiated. As the grain size becomes larger, the current mobility also becomes larger, as shown in FIG. 4.

Therefore, in the embodiment of the present invention shown in FIG. 10, the crystal grain size on the channel region $C_r$ of the driving TFT second active layer of the R sub-pixel, which requires the higher current mobility, is formed to be the largest, the crystal grain on the channel region $C_o$ of the second active layer of the B sub-pixel, which requires smaller current mobility than that of the R sub-pixel, is formed to be smaller than that of R sub-pixel, and the crystal grain size of the channel region $C_g$ of the G sub-pixel, which requires the smallest current mobility, is formed to be the smallest. When the thickness of the silicon thin film becomes thinner, energy density on the amorphous silicon becomes higher, and accordingly, the larger crystal grain can be obtained.

When the amorphous silicon thin film receives the laser having excessively high energy density, the silicon may be melted, and the grain size may be small. Therefore, it may be desirable that the thickness (dr) of the silicon thin film having the third crystallization structure, on which the second active layer 21r of the R sub-pixel requiring larger crystal grain, not be too thick.

Therefore, the thickness of the channel regions on the second active layers become thinner in order of G, B, and R color sub-pixels. The different thickness of the silicon thin film can be formed in a half-tone method in the well-known photolithography method. The regions, on which the R, G, and B sub-pixels will be formed, are exposed to light using an optical mask having a different light transmittance for the R, G, and B colors, and then etched to form the layers having different thickness through a process.

As described above, the thickness (dr) of the silicon thin film, on which the second active layer 21r of the R sub-pixel will be formed, is thinner than that (db) of the silicon thin film, on which the second active layer 21b of the B sub-pixel will be formed, and the thickness (db) of the silicon thin film is thinner than that (dg) of the silicon thin film, on which the second layer 21g of the G sub-pixel will be formed. Accordingly, the crystallization grain size of the second active layer 21r of the R sub-pixel is the largest, and the grain size of the second active layer 21g of the G sub-pixel is the smallest. Therefore, the current mobility becomes larger in order of G, B, and R sub-pixels, and consequently, the current flowing on the pixels becomes larger in order of the G, B, and R sub-pixels under the same driving voltages. Thus, the white balance can be maintained under the same driving voltages. Also, the crystal grain sizes can be differentiated through one laser radiating process using the different thickness, thus simplifying the fabrication process.

Figure 12:
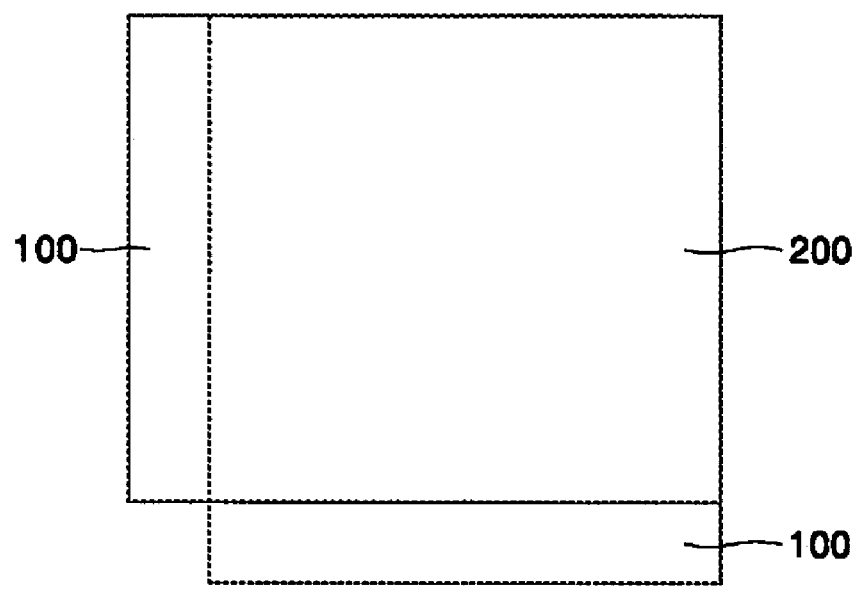
FIG. 12 is a plane view of an active matrix type electroluminescence display device according to another embodiment of the present invention.

FIG. 12 is a plane view of an active matrix type organic electroluminescence device according to still another embodiment of the present invention. Referring to FIG. 12, the organic electroluminescence device includes a pixel area 200, and a circuit area 100 on a boundary of the pixel area 200.

The pixel area 200 includes a plurality of pixels, and each of the pixels includes a plurality of sub-pixels having organic electroluminescence devices. In a full color organic electroluminescence device, the R, G, and B color sub-pixels are arranged in a various patterns, such as a line pattern, a mosaic pattern, and a grid pattern to form the pixel. The arrangement may also be applied in the mono color organic electroluminescence device.

In addition, the circuit area 100 supplies electric power to drive the pixel area 200, and controls image signals input into the pixel area 200. In the organic electroluminescence device, the pixel area 200 and the circuit area 100 may include at least one or more thin film transistors.

The switching TFT, which transmits a data signal to the electroluminescence device according to a signal of the gate line to control the operation of the device, and the driving TFT, which operates the organic electroluminescence device so that a predetermined electric current flows on the device according to the data signal, may be installed on the pixel area 200. These above pixels are referred to as pixel unit TFTs. In addition, a circuit unit TFT, which is installed on the circuit area 100, may be installed to realize a predetermined circuit. The number and arrangement of the TFTs may be varied from the characteristics of the display.

Each of the TFTs includes a semiconductor active layer formed by amorphous silicon or polycrystalline silicon, where the semiconductor active layer includes a channel region. The channel region is located on center portions of a source area and a drain area, and a gate electrode is insulated on an upper portion of the channel region.

Figure 13:
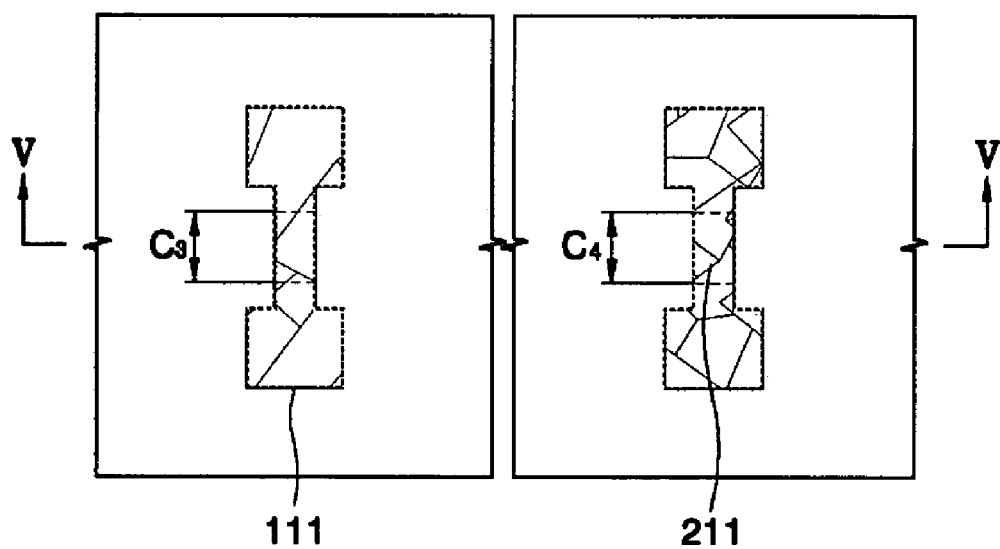
FIG. 13 is a plane view of crystallization structures of active layers in a circuit unit TFT and a pixel unit TFT.
Figure 14:
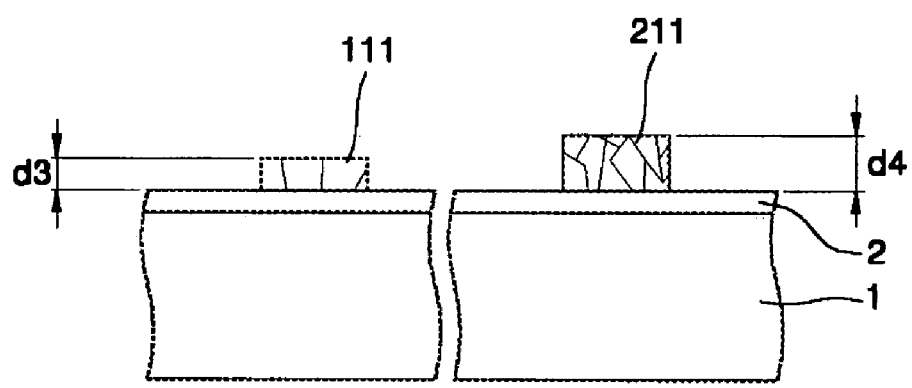
FIG. 14 is a cross-sectional view in the direction of line V-V of FIG. 13, showing different thickness of the active layers in the circuit unit TFT and the pixel unit TFT.

FIG. 13 illustrates the active layers of the circuit unit TFT and the pixel unit TFT, and FIG. 14 is a cross-sectional view in the direction of line V-V.

As shown in FIG. 13, the active layer 111 of the circuit unit TFT and the active layer 211 of the pixel unit TFT include the channel regions C3 and C4 on center portions thereof. In an embodiment of the present invention, the active layers 111 and 211 can be formed to have different thickness as shown in FIG. 14. That is, the thickness (d3) of the active layer 111 of the circuit unit TFT is thinner than the thickness (d4) of the active layer 211 of the pixel unit TFT. It is sufficient that the channel regions C3 and C4 on the center portions of the active layers 111 and 211 have different thickness from each other. However, the entire thickness of the active layers 111 and 211 are shown different from each other.

The different thickness of the active layers 111 and 211 can be decided by the current mobility on the channel regions. That is, the thickness of the active layer of the TFT, which requires a larger current mobility value than the other TFT, is formed to be thinner than the other TFT.

When the thickness of the active layer is thin, the current mobility on the channel region becomes larger, and accordingly, improved TFT characteristics can be obtained. Therefore, if the thickness of the channel area on the active layer of the TFT, which requires a higher current mobility, is formed to be thin, improved TFT characteristics can be obtained.

However, the circuit unit TFT requires a higher response property, while the pixel unit TFT requires a higher uniformity.

Accordingly, as shown in FIG. 14, the thickness d3 of the active layer 11 of the circuit unit TFT is formed to be thinner than that d4 of the active layer 211 of the pixel unit TFT, to provide the circuit unit with the TFTs having a higher response property. The above effect is also applied to the active layer formed using the amorphous silicon, as well as the polycrystalline silicon.

The pixel unit TFT includes the switching TFT for transmitting the data signal to the device and the driving TFT for operating the electroluminescence device. Since the switching TFT performs the switching operation, the switching TFT requires a higher response property than that of the driving TFT, and the driving TFT requires a higher uniformity rather than the response property. Therefore, it is desirable that the channel region of the active layer of the circuit unit TFT is thinner than that the channel region of the active layer of the driving TFT in the pixel unit TFT.

On the other hand, since the thickness of the active layers 111 and 211 are different from each other, the crystal grain sizes of the circuit unit TFT and the pixel unit TFT can be formed differently from each other when the amorphous silicon is crystallized into the polycrystalline silicon. Accordingly, the current mobilities in the TFTs can be differentiated. Different grain sizes can be obtained through one laser radiating process to the two layers without an additional process, such as, for example, when the crystallization is performed in ELA method.

It is desirable that the grain size on the active layer of the TFT, which requires a higher current mobility than the other TFT, is larger than that of the other TFT, since when the grain size is large on the active layer, the current mobility on the channel region also becomes larger. The larger the grain size is, the larger the current mobility becomes, as shown in FIG. 4.

Therefore, according to an embodiment the present invention as shown in FIG. 13, the grain size of the channel region on the active layer of the TFT, which requires high current mobility, that is, the circuit unit TFT, is larger than that of the channel region on the active layer of the TFT, which requires small current mobility, that is, the pixel unit TFT.

Since the switching TFT requires a higher response property than the driving TFT and the driving TFT requires a high uniformity for realizing a higher resolution, it is desirable that the crystal grain size of the active layer of the circuit unit TFT is larger than that the crystal grain size of the active layer of the driving TFT.

The different crystal grain sizes can be obtained by differentiating the thickness of the active layers. That is, when the thickness d3 of the active layer 111 on the circuit unit TFT is thinner than that d4 of the active layer 211 on the pixel unit TFT, the energy density of the laser received by the amorphous silicon having a thinner thickness becomes higher, and accordingly, a larger crystal grain size can be obtained. The size of the crystal grain according to the energy density can be decided by the relation shown in FIG. 5. As shown in FIG. 5, when the amorphous silicon receives the laser having an excessively high energy density, the silicon may be completely melted and the crystal grain size may become smaller. Therefore, it may be desirable for the silicon thin film, on which the active layer 111 of the circuit unit TFT is formed, to not be thin.

According to another embodiment of the present invention, it may be desirable that the thickness d3 of the silicon thin film, on which the active layer of the TFT requiring a higher current mobility, that is, the circuit unit TFT, may be formed in a range of about 300 to about 800 Å. In addition, the thickness d4 of the silicon thin film, on which the active layer 211 of the TFT requiring small current mobility, that is, the pixel unit TFT, is in a range of about 500 to about 1500 Å. The different thickness of the silicon thin films may be formed in the photolithography method, the thickness of the patterned amorphous silicon thin film may be controlled by controlling the light transmittance of optical mask with respect to the regions, on which the active layers of the circuit unit TFT and the pixel unit TFT may be formed.

The crystal grain sizes of the active layers can be formed differently from each other with one laser radiating process using the different thickness, thus simplifying the fabrication process.

The processes of forming TFTs having different crystallization structures can be adopted in a complementary metal oxide semiconductor (CMOS) TFT. Since the crystal grain size of the polycrystalline silicon included in the active area affects the electronic properties of the TFT, that is, the current mobility and the threshold voltage, the electronic properties of the CMOS TFT can be improved by controlling the crystal grain sizes of the polycrystalline silicon included in the P type TFT and N type TFT of the CMOS TFT.

Figure 15A:
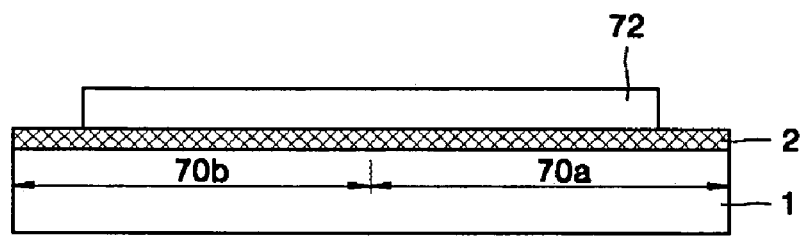
FIGS. 15A, 15B, 15C, 15D, 15E, 15F, 15G, 15H and 15I illustrate processes for fabricating a complementary metal oxide semiconductor (CMOS) TFT according to still another embodiment of the present invention.

FIGS. 15A, 15B, 15C, 15D, 15E, 15F, 15G, 15H and 15I are views of processes for fabricating the CMOS TFT. As shown in FIG. 15A, a buffer layer 2 is deposited on a substrate 1 including N type TFT region 70a and P type TFT region 70b. $SiO_2$ can be used as the buffer layer 2. After depositing the buffer layer 2, the amorphous silicon 72 is deposited on the buffer layer 2. Here, the amorphous silicon is deposited to have a thickness of about 500 to about 1500 Å.

Figure 15B:
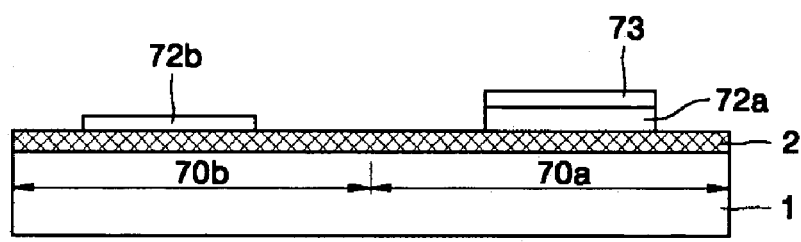

As shown in FIG. 15B, a photoresist pattern 73 is formed on the amorphous silicon 2 on the N type TFT region 70a, and the amorphous silicon is dry-etched. Then, the amorphous silicon 72b on the P type TFT region 70b is etched as deep as a predetermined depth, the thickness of the amorphous silicon 72a and the amorphous silicon 72b become different from each other. Here, the thickness of the amorphous silicon 72b remained on the P type TFT is about 300 to about 800 Å.

Figure 15C:
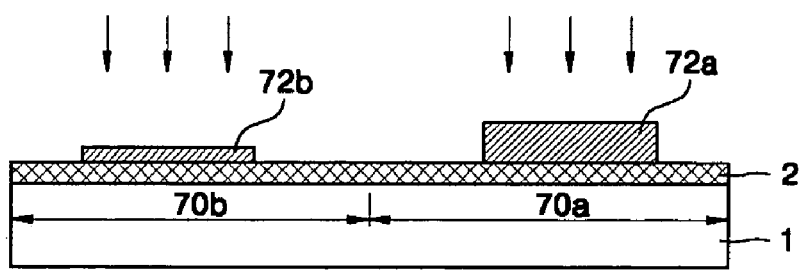

After removing the photoresist 72, the laser is radiated on the amorphous silicon to crystallize the amorphous silicon into the polycrystalline silicon as shown in FIG. 15C. Here, since the thickness of the amorphous silicon 72b on the P type TFT region 70b is thinner than that of the amorphous silicon 72a on the N type TFT region 70b, the amorphous silicon 72b on the P type TFT region 70b is crystallized after being melted completely, and the amorphous silicon 72a on the N type TFT region 70a is crystallized after being partially melted. Therefore, the crystal grain size of the polycrystalline silicon formed on the P type TFT region 70b becomes larger, and the crystal grain size of the polycrystalline silicon formed on the N type TFT region 70a is smaller than that of the P type TFT region 70b.

Here, since the crystal grain size of the P type TFT region 70b is larger than that of the N type TFT region 70a, less grain boundaries are included in the P type TFT region 70b. On the other hand, when the amorphous silicon is crystallized using the laser, grain boundaries are formed between the grains. The grain boundaries affect the current mobilities and the threshold voltages of the P type TFT and the N type TFT, when the device is fabricated. That is, the grain boundary operates as a trap with respect to electric charge carriers.

Here, as shown in FIG. 4, as the grain size becomes larger, the current mobility increases. Therefore, since the number of grain boundaries included in the P type TFT region is small, the current mobility increases and the threshold voltage is reduced relatively on the N type TFT region. Thus, the difference between the electronic properties of the P type TFT and the N type TFT is reduced.

Here, widths of the channel regions of the N type TFT and the P type TFT are formed to be same as each other. It may be desirable that the laser excimer annealing (ELA) method is used as the laser crystallization method, and a laser of about 320 mJ/cm$^2$ energy is used.

Figure 15D:
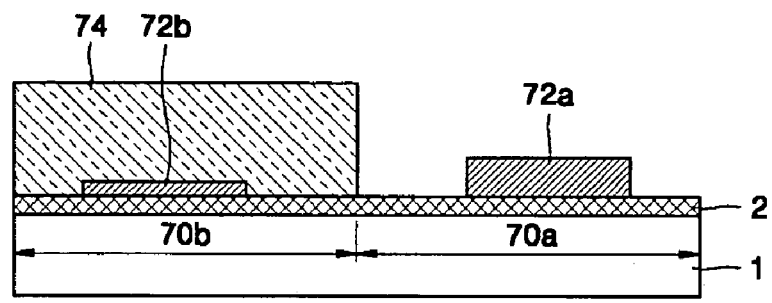

As shown in FIG. 15D, after forming the polycrystalline silicon pattern, the polycrystalline silicon pattern 72a of the N type TFT region 70a is exposed to make the N type TFT conductive, and the channel doping is performed to be N type dopant using the patterned photoresist 74 as a mask.

The N type TFT is not limited to a certain structure and may be formed to have a general N type TFT structure, a lightly doped drain (LDD) structure, or an off-set structure. In the present invention, the processes will be described with respect to the CMOS TFT having the LDD structure.

Figure 15E:
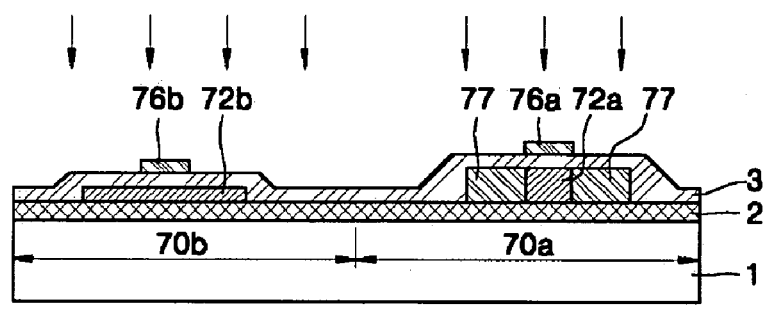

As shown in FIG. 15E, the photoresist 74 is removed, a gate insulating layer 3 is formed on the substrate 1, and gate electrode material is deposited on the gate insulating layer 3 in addition, gate electrodes 76a and 76b of the N type TFT and P type TFT are formed on the substrate 1 using the mask. In order to form the LDD structure, impurities of a low concentration are ion-implanted into the polycrystalline silicon pattern 72a of the N type TFT region 70a to form source/drain area 77 of a low concentration on both sides of the gate electrode 76a.

Figure 15F:
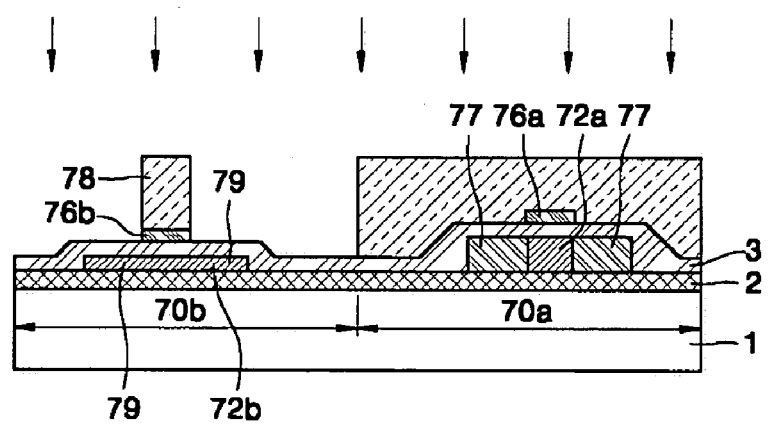

As shown in FIG. 15F, the photoresist is applied on the entire surface of the substrate 1, on which the low concentration source/drain area 77 is formed. The photolithography process is performed to prevent the impurities from being injected into the N type TFT region 70a and to form the mask for forming source/drain area of the P type TFT. The P type impurities of a high concentration are ion-implanted into the polycrystalline silicon pattern 72b of the P type TFT region 70b using the mask 78 to form a high concentrated source/drain area 79.

Figure 15G:
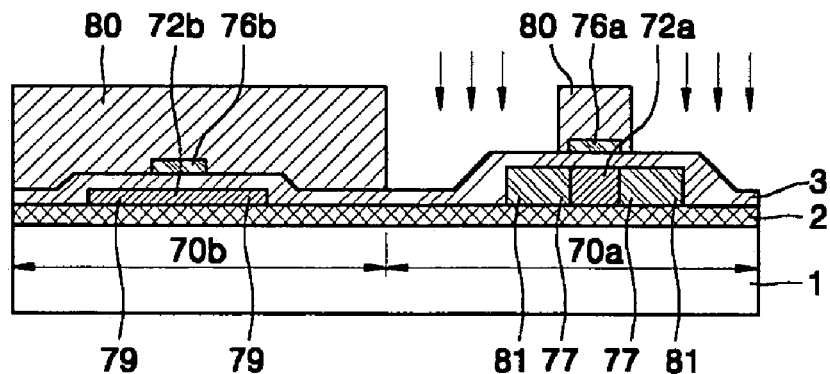

As shown in FIG. 15G, the photoresist pattern is applied on the substrate 1 after removing the mask, and the photolithograph process is performed to form the gate electrode and the mask 80, which prevents the impurities from being injected into the P type TFT region 70a. In addition, N type high concentrated impurities are ion-implanted into the polycrystalline pattern 72a of the N type TFT region 70a using the mask 80 to form high concentrated source/drain area 81.

Figure 15H:
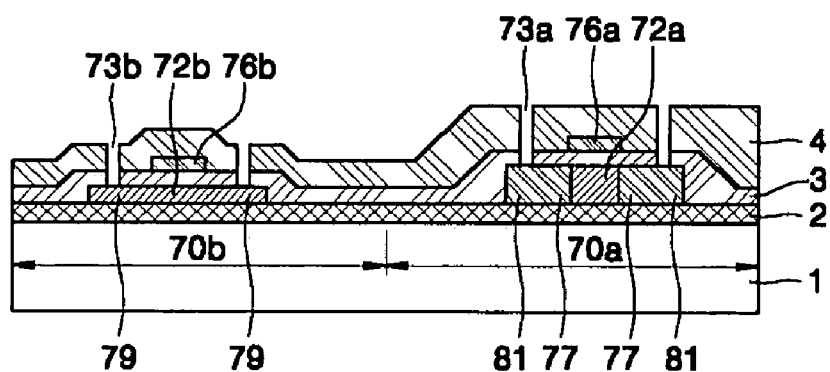

As shown in FIG. 15H, an interlayer dielectric 4 is formed, on the entire surface of the substrate 1 after removing the mask 80. Then, the mask is located on the substrate 1 to etch the interlayer dielectrics 4 so as to expose the source/drain areas 79 and 81 of the N type TFT and P type TFT and to form contact holes 73a and 73b on the N type TFT region 70a and the P type TFT region 70b.

Figure 15I:
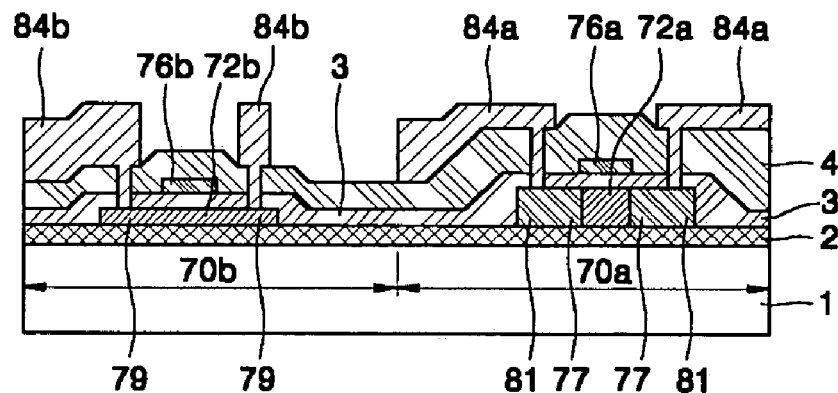

In addition, as shown in FIG. 15I, conductive metallic material is deposited on the entire surface of the substrate 1 to form source/drain electrodes, and the metallic material is etched using the mask to form the source/drain electrodes 84a and 84b of the N type TFT and the P type TFT.

The CMOS TFT having the N type TFT of LDD structure and the P type TFT of general structure can be fabricated as described above.

Figure 16A:
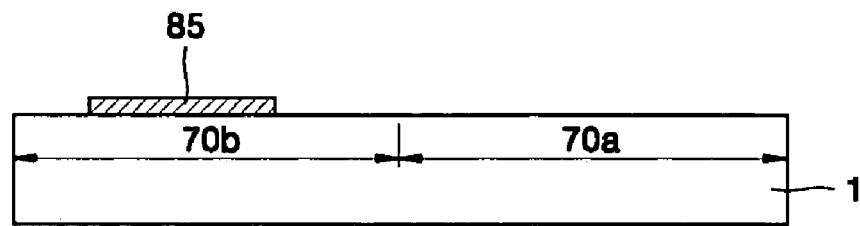
FIGS. 16A, 16B and 16C illustrate processes for fabricating a CMOS TFT according to still another embodiment of the present invention.
Figure 16B:
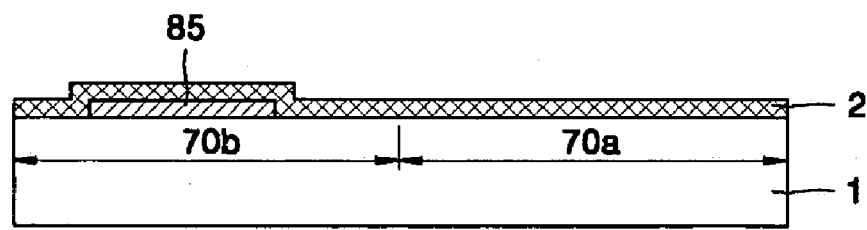
Figure 16C:
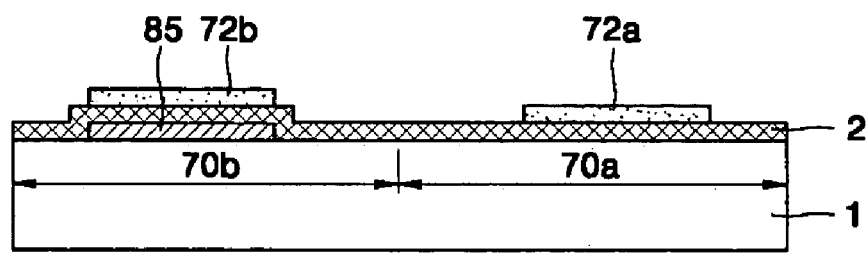

FIGS. 16A, 16B and 16c illustrate different crystal grain sizes of the polycrystalline silicon formed on the polycrystalline silicon patterns 72a and 72b of the P type TFT region and the N type TFT region.

Referring to FIGS. 16A through 16C, an insulating layer 85, such as SiNx, is formed on the P type TFT region 70b, on which the P type TFT is formed. As shown in FIG. 16B, the buffer layer 2 is formed on the entire surface of the substrate 1. SiO$_2$ can be used as the buffer layer 2. The amorphous silicon is deposited uniformly on the entire substrate 1, and after that, the amorphous silicon is crystallized by the laser using the mask to form the polycrystalline silicon patterns 72a and 72b.

Here, since the insulating layer, such as SiNx is applied on the lower portion of the P type TFT, the energy of the radiated laser is transmitted less than that of the N type TFT region. That is, since the heat conductivity of the P type TFT is smaller than that the heat conductivity of the N type TFT, the energy affecting the amorphous silicon of the P type TFT region is larger than of the energy affecting the amorphous silicon of the N type TFT region, and the P type transistor region is melted more than the N type TFT region. Therefore, the crystal grain size of the P type TFT region is larger than on the crystal grain size of the N type TFT region. Thus the difference between electronic properties of the P type TFT and the N type TFT is reduced.

The ELA method is used as the laser crystallization method, and the laser of about 320 mJ/cm$^2$ is used. Processes after the above process are same as those shown in FIGS. 15D, 15E, 15F, 15G, 15H and 15I.

As described above, the CMOS TFT, in which the crystal grain size of the polycrystalline silicon on the active channel region of the N type TFT is smaller than that of the P type TFT is used in the display devices, and more preferably, used in the active device type LCD or the organic electroluminescence device.

In the above descriptions, the present invention is applied to the organic electroluminescence display device. However, the scope of the present invention is not limited thereto. The TFT according to the present invention can be applied to any display devices such as a liquid crystal display (LCD), and inorganic electroluminescence display devices.

According to the present invention, a current transferred from the driving TFT to the light emitting device can be reduced without changing the size of the active layer in the TFT or the driving voltage, and accordingly, a structure suitable for realizing the high resolution can be obtained. A switching TFT having excellent switching properties can be obtained, and at the same time, a driving TFT with a higher resolution can be realized using properties of the polycrystalline silicon. Also, excellent response characteristics and the higher resolution can be realized by controlling the thickness of one active layer. In addition, a structure having crystal grains of different sizes can be obtained with one irradiation of the laser by generating a difference in the thickness of the amorphous silicon thin film. Accordingly, the current mobility values on the channel regions of the switching TFT and the driving TFT can be different from each other. The crystallization structure of a TFT according to the present invention is capable of maintaining a more uniform brightness and preventing the life time of the display from degrading. The aperture area is not reduced since there is no need to increase the length (L) of the driving TFT. Also, a reliability of the TFT can be improved since there is no need to reduce the width (W) of the driving TFT.

The white balance can be achieved with active layers of same size without changing the size of the active layer in the TFT or the driving voltage. In addition, since the current suitable for each of the sub-pixels is supplied, appropriate brightness can be obtained and the lifespan is not degraded. Also, the amount of current flowing in the device can be controlled without increasing the size of the driving TFT in the sub-pixel, thus improving the reliability and preventing the aperture rate from reducing.

In addition, the properties of the circuit unit TFT can be improved without changing the size of TFT active layer or the driving voltage. The uniformity of the pixel unit TFT is improved to be suitable for the higher resolution. An improved response property and the higher resolution can be obtained by controlling the thickness of the active layer. In addition, crystal grains having different sizes can be obtained through one laser radiation process by differentiating the thickness of the polycrystalline silicon thin films. Accordingly, the current mobility values on the active channel region of the circuit unit TFT and the pixel unit TFT can be differentiated.

A more uniform brightness can be obtained and the lifespan degradation can be prevented by the crystallization structure of the TFT. In addition, there is no need to increase the length of the pixel unit TFT, thus the aperture rate is not reduced. Also, there is no need to reduce the width of the pixel unit TFT, thus improving the reliability. The absolute values of the threshold voltages and the current mobility can be controlled by differentiating the crystal grain sizes on the N type TFT and the P type TFT included in the CMOS TFT, thus improving electronic properties of the CMOS TFT.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. A flat panel display, comprising:
  a light emitting device; and
  at least two or more thin film transistors including semiconductor active layers having simultaneously formed channel regions,
  wherein a thickness of the channel regions of the thin film transistors are different from each other, a thickness of a channel region of a switching thin film transistor being thinner than a thickness of a channel region of an other thin film transistor,
  wherein the semiconductor active layer is formed using polycrystalline silicon, and a size of crystal grain on the channel region of the switching thin film transistor is larger than a size of the crystal grain on the channel region of the other thin film transistor,
  wherein the polycrystalline silicon is formed in a crystallization method using a laser, and
  wherein the channel regions of the thin film transistors are formed by irradiating the laser to the regions simultaneously.

2. The flat panel display of claim 1, wherein the thickness of the channel region of the thin film transistor which requires larger current mobility than that of the other thin film transistor, is thinner than that the thickness of the channel region of the other thin film transistor.

3. The flat panel display of claim 1, wherein the thin film transistors include a switching thin film transistor for transmitting a data signal, and a driving thin film transistor for operating the light emitting device so that a predetermined current flows in the emitting device according to the data signal, and where the thickness of the channel region of the switching thin film transistor is thinner than the thickness of the channel region of the driving thin film transistor.

4. The flat panel display of claim 3, wherein the thickness of the channel region of the switching thin film transistor is about 300 to about 800 Å.

5. The flat panel display of claim 3, wherein the thickness of the channel region of the driving thin film transistor is about 500 to about 1500 Å.

6. The flat panel display of claim 3, wherein the semiconductor active layer is formed using a polycrystalline silicon, and a crystal grain on the channel region of the switching thin film transistor is larger than a crystal grain on the channel region of the driving thin film transistor.

7. The flat panel display of claim 6, wherein the polycrystalline silicon is formed in a crystallization method using a laser.

8. The flat panel display of claim 7, wherein the channel region of the switching thin film transistor and the channel region of the driving thin film transistor are formed by irradiating the laser to the regions simultaneously.

9. The flat panel display of claim 1, wherein the light emitting device is included in each of plurality of sub-pixels having at least two different colors, the thin film transistors include a driving thin film transistor connected between the sub-pixel and the light emitting device to supply the electric current to the emitting device, and the thickness of the channel regions of the driving thin film transistors are different for each of the colors of the sub-pixels.

10. The flat panel display of claim 9, wherein the thickness of the channel regions in the driving thin film transistors are decided to be in inverse proportion to the currents flowing on the sub-pixels.

11. The flat panel display of claim 9, wherein the thickness of the channel regions in the driving thin film transistors are decided to be in inverse proportion to the current mobility values of the channel regions of the sub-pixels.

12. The flat panel display of claim 9, wherein the sub-pixels respectively have red, green, and blue colors, and the thickness of the channel region on the driving thin film transistor of green sub-pixel is thicker than the thickness of the channel region on the red and blue sub-pixels.

13. The flat panel display of claim 9, wherein the sub-pixels respectively have red, green, and blue colors, and the thickness of the channel region on the driving thin film transistor of the red sub-pixel is thinner than of the thickness of the channel region on the green and blue sub-pixels.

14. The flat panel display of claim 9, wherein the sub-pixels respectively have red, green, and blue colors, and the thickness of the channel regions on the driving thin film transistors become thinner in order of green, blue, and red color sub-pixels.

15. The flat panel display of claim 9, wherein the semiconductor active layer is formed using a polycrystalline silicon, and the sizes of crystal grains on the channel regions of the driving thin film transistors are different for each of the colors of sub-pixels.

16. The flat panel display of claim 15, wherein the sub-pixels respectively have red, green, and blue colors, and a crystal grain size on the channel region of the driving thin film transistor of green sub-pixel is smaller than a crystal grain size or the channel region of the red and blue sub-pixels.

17. The flat panel display of claim 15, wherein the sub-pixels respectively have red, green, and blue colors, and a crystal grain size on the channel region of the driving thin film transistor of red sub-pixel is larger than a crystal grain size on the channel region of the green and blue sub-pixels.

18. The flat panel display of claim 15, wherein the sub-pixels respectively have red, green, and blue colors, and a crystal grain sizes on the channel regions of the driving thin film transistors become larger in order of green, blue, and red sub-pixels.

19. The flat panel display of claim 15, wherein the semiconductor active layer is formed using the polycrystalline silicon, and the polycrystalline silicon is formed in a crystallization method using a laser.

20. The flat panel display of claim 19, wherein the channel regions of the sub-pixels are formed by irradiating the laser to the regions simultaneously.

21. The flat panel display of claim 1, further comprising a pixel area including a plurality of light emitting devices, and a circuit area controlling a signal applied to the pixel area,
wherein the thin film transistor includes a pixel unit thin film transistor, which is located on the pixel area, and a circuit unit thin film transistor, which is located on the circuit area,
and the thickness of the channel area of the circuit unit thin film transistor is thinner than the thickness of the channel area of the pixel unit thin film transistor.

22. The flat panel display of claim 21, wherein the thickness of the channel region of the circuit unit thin film transistor is thinner than that the thickness of the channel area of the driving thin film transistor, which operates the emitting device by making a predetermined current flow on the emitting device according to the data signal, in the circuit unit thin film transistors.

23. The flat panel display of claim 21, wherein the thickness of the channel region of the pixel unit thin film transistor is about 300 to about 800 Å.

24. The flat panel display of claim 21, wherein the thickness of the channel region of the circuit unit thin film transistor is about 500 to about 1500 Å.

25. The flat panel display of claim 21, wherein the semiconductor active layer is formed using a polycrystalline silicon, and a size of the crystal grain on the channel region of the circuit unit thin film transistor is larger than a size of the crystal grain on a channel region of the pixel unit thin film transistor.

26. The flat panel display of claim 25, wherein the size of the crystal grain on the channel region of the circuit unit thin film transistor is larger than of the size of the crystal grain on the channel region of the driving thin film transistor, which operates the emitting device by making a predetermined current flow on the emitting device according to the data signal, in the circuit unit thin film transistors.

27. The flat panel display of claim 25, wherein the polycrystalline silicon is formed in a crystallization method using a laser.

28. The flat panel display of claim 25, wherein the channel region of the circuit unit thin film transistor and the channel region of the pixel unit thin film transistor are formed by irradiating the laser to the regions simultaneously.

29. The flat panel display of claim 1, wherein the thin film transistor is a complementary metal oxide semiconductor (CMOS) thin film transistor including a P type thin film transistor and N type thin film transistor, and a thickness of the channel region of the P type thin film transistor is thinner than the thickness of the channel region of the N type thin film transistor.

30. The flat panel display of claim 29, wherein the thickness of the channel region of the P type thin film transistor is about 300 to about 800 Å.

31. The flat panel display of claim 29, wherein the thickness of the channel region of the N type thin film transistor is about 500 to about 1500 Å.

32. The flat panel display of claim 29, wherein the semiconductor active layer is formed using a polycrystalline silicon, and a size of crystal grain on the channel region of the P type thin film transistor is larger than a size of crystal grain on the channel region of the N type thin film transistor.

33. The flat panel display of claim 32, wherein the polycrystalline silicon is formed in a crystallization method using laser.

34. The flat panel display of claim 33, wherein the channel region of the P type thin film transistor and the channel region of the N type thin film transistor are formed by irradiating the laser to the regions simultaneously.

35. A flat panel display, comprising:
a light emitting device; and
at least two or more thin film transistors including semiconductor active layers of polycrystalline silicon having channel regions,
wherein a thickness of the channel regions of the thin film transistors are different from each other, and
wherein the thin film transistors include a switching thin film transistor for transmitting a data signal, and a driving thin film transistor for operating the light emitting device so that a predetermined current flows in the emitting device according to the data signal, and where the thickness of the channel region of the switching thin film transistor is thinner than the thickness of the channel region of the driving thin film transistor, and a size of crystal grain on the channel region of the switching thin film transistor is larger than a size of the crystal grain on the channel region of the driving thin film transistor.

36. A flat panel display, comprising:
a light emitting device; and
at least two or more thin film transistors including semiconductor active layers of polycrystalline silicon having channel regions,
wherein a thickness of the channel regions of the thin film transistors are different from each other, and
wherein the light emitting device is included in each of plurality of sub-pixels having at least two different colors, the thin film transistors include a driving thin film transistor connected between the sub-pixel and the light emitting device to supply the electric current to the emitting device, the thickness of the channel regions of the driving thin film transistors are different for each of the colors of the sub-pixels, and the grain sizes of the channel regions of the driving thin film transistors are different for each of the colors of the sub-pixels.

37. A flat panel display, comprising:
a light emitting device;
at least two or more thin film transistors including semiconductor active layers of polycrystalline silicon having channel regions; and
a pixel area including a plurality of light emitting devices, and a circuit area controlling a signal applied to the pixel area, wherein the thin film transistor includes a pixel unit thin film transistor, which is located on the pixel area, and a circuit unit thin film transistor, which is located on the circuit area, wherein the thickness of the channel area of the circuit unit thin film transistor is thinner than the thickness of the channel area of the pixel unit thin film transistor, and a size of crystal grain on the channel area of the circuit thin film transistor is larger than a size of the crystal grain on the channel region of the pixel unit thin film transistor.

* * * * *